(12) United States Patent
Lee et al.

(10) Patent No.: US 9,129,862 B2
(45) Date of Patent: Sep. 8, 2015

(54) MICROELECTRONIC DEVICES AND MICROELECTRONIC SUPPORT DEVICES, AND ASSOCIATED ASSEMBLIES AND METHODS

(71) Applicant: Micron Technology, Inc., Boise, ID (US)

(72) Inventors: Teck Kheng Lee, Singapore (SG); David Yih Ming Chai, Singapore (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/331,722

(22) Filed: Jul. 15, 2014

(65) Prior Publication Data
US 2014/0326488 A1 Nov. 6, 2014

Related U.S. Application Data

(62) Division of application No. 13/171,137, filed on Jun. 28, 2011, now Pat. No. 8,778,732, which is a division of application No. 11/617,567, filed on Dec. 28, 2006, now Pat. No. 7,968,369, which is a division of application No. 11/218,256, filed on Sep. 1, 2005, now Pat. No. 8,174,101.

(30) Foreign Application Priority Data

Aug. 24, 2005 (SG) .................................. 200505410

(51) Int. Cl.
*H01L 21/00* (2006.01)
*H01L 23/02* (2006.01)
(Continued)

(52) U.S. Cl.
CPC .......... *H01L 23/12* (2013.01); *H01L 21/76898* (2013.01); *H01L 23/13* (2013.01);
(Continued)

(58) Field of Classification Search
CPC ............. H01L 2224/4824; H01L 2224/48472; H01L 2224/48227; H01L 2224/04042

USPC .................... 257/723–738, 777–784, E23.02, 257/E23.021
See application file for complete search history.

(56) References Cited

U.S. PATENT DOCUMENTS

| | | |
|---|---|---|
| 4,807,021 A | 2/1989 | Okumura |
| 5,062,565 A | 11/1991 | Wood et al. |

(Continued)

FOREIGN PATENT DOCUMENTS

| | | |
|---|---|---|
| DE | 195 36 278 A1 | 4/1997 |
| JP | 2001044357 A | 2/2001 |

(Continued)

OTHER PUBLICATIONS

International Search Report and Written Opinion for Application No. PCT/US2006/031600, 13 pages, mailed Feb. 21, 2007.

(Continued)

*Primary Examiner* — Cuong Q Nguyen
(74) *Attorney, Agent, or Firm* — Perkins Coie LLP

(57) ABSTRACT

Microelectronic devices, associated assemblies, and associated methods are disclosed herein. For example, certain aspects of the invention are directed toward a microelectronic device that includes a microfeature workpiece having a side and an aperture in the side. The device can further include a workpiece contact having a surface. At least a portion of the surface of the workpiece contact can be accessible through the aperture and through a passageway extending between the aperture and the surface. Other aspects of the invention are directed toward a microelectronic support device that includes a support member having a side carrying a support contact that can be connectable to a workpiece contact of a microfeature workpiece. The device can further include recessed support contact means carried by the support member. The recessed support contact means can be connectable to a second workpiece contact of the microfeature workpiece.

17 Claims, 4 Drawing Sheets

(51) Int. Cl.
  *H01L 23/12* (2006.01)
  *H01L 21/768* (2006.01)
  *H01L 23/13* (2006.01)
  *H01L 23/31* (2006.01)
  *H01L 23/48* (2006.01)
  *H01L 23/00* (2006.01)

(52) U.S. Cl.
  CPC ........ *H01L23/3121* (2013.01); *H01L 23/3135* (2013.01); *H01L 23/481* (2013.01); *H01L 24/05* (2013.01); *H01L 24/06* (2013.01); *H01L 24/32* (2013.01); *H01L 24/48* (2013.01); *H01L 24/49* (2013.01); *H01L 24/73* (2013.01); *H01L 24/45* (2013.01); *H01L 24/85* (2013.01); *H01L 2224/04042* (2013.01); *H01L 2224/05571* (2013.01); *H01L 2224/05599* (2013.01); *H01L 2224/06136* (2013.01); *H01L 2224/2518* (2013.01); *H01L 2224/32225* (2013.01); *H01L 2224/45144* (2013.01); *H01L 2224/4809* (2013.01); *H01L 2224/4824* (2013.01); *H01L 2224/4845* (2013.01); *H01L 2224/48091* (2013.01); *H01L 2224/48095* (2013.01); *H01L 2224/48227* (2013.01); *H01L 2224/48235* (2013.01); *H01L 2224/48464* (2013.01); *H01L 2224/48472* (2013.01); *H01L 2224/48599* (2013.01); *H01L 2224/49* (2013.01); *H01L 2224/73215* (2013.01); *H01L 2224/73265* (2013.01); *H01L 2224/85203* (2013.01); *H01L 2224/85205* (2013.01); *H01L 2224/85399* (2013.01); *H01L 2924/0002* (2013.01); *H01L 2924/00014* (2013.01); *H01L 2924/014* (2013.01); *H01L 2924/01005* (2013.01); *H01L 2924/01006* (2013.01); *H01L 2924/01014* (2013.01); *H01L 2924/01028* (2013.01); *H01L 2924/01029* (2013.01); *H01L 2924/01031* (2013.01); *H01L 2924/01032* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/09701* (2013.01); *H01L 2924/10253* (2013.01); *H01L 2924/14* (2013.01); *H01L 2924/15192* (2013.01); *Y10T 29/49826* (2015.01)

(56) References Cited

U.S. PATENT DOCUMENTS

| | | | |
|---|---|---|---|
| 5,128,831 A | 7/1992 | Fox, III et al. | |
| 5,252,857 A | 10/1993 | Kane et al. | |
| 5,518,957 A | 5/1996 | Kim | |
| RE35,385 E | 12/1996 | Gloton | |
| 5,593,927 A | 1/1997 | Farnworth et al. | |
| 5,739,050 A | 4/1998 | Farnworth | |
| 5,815,000 A | 9/1998 | Farnworth et al. | |
| 5,883,426 A | 3/1999 | Tokuno et al. | |
| 5,891,797 A | 4/1999 | Farrar | |
| 5,894,218 A | 4/1999 | Farnworth et al. | |
| 5,946,553 A | 8/1999 | Wood et al. | |
| 5,986,209 A | 11/1999 | Tandy | |
| 5,990,566 A | 11/1999 | Farnworth et al. | |
| 6,011,694 A | 1/2000 | Hirakawa et al. | |
| 6,018,249 A | 1/2000 | Akram et al. | |
| 6,020,624 A | 2/2000 | Wood et al. | |
| 6,020,629 A | 2/2000 | Farnworth et al. | |
| 6,025,728 A | 2/2000 | Hembree et al. | |
| 6,028,365 A | 2/2000 | Akram et al. | |
| 6,048,744 A | 4/2000 | Corisis et al. | |
| 6,051,878 A | 4/2000 | Akram et al. | |
| 6,072,233 A | 6/2000 | Corisis et al. | |
| 6,072,236 A | 6/2000 | Akram et al. | |
| 6,072,323 A | 6/2000 | Hembree et al. | |
| 6,081,429 A | 6/2000 | Barrett | |
| 6,089,920 A | 7/2000 | Farnworth et al. | |
| 6,094,058 A | 7/2000 | Hembree et al. | |
| 6,097,087 A | 8/2000 | Farnworth et al. | |
| 6,107,122 A | 8/2000 | Wood et al. | |
| 6,130,474 A | 10/2000 | Corisis | |
| 6,148,509 A | 11/2000 | Schoenfeld et al. | |
| 6,150,717 A | 11/2000 | Wood et al. | |
| 6,163,956 A | 12/2000 | Corisis | |
| 6,165,887 A | 12/2000 | Ball | |
| 6,175,149 B1 | 1/2001 | Akram | |
| 6,188,232 B1 | 2/2001 | Akram et al. | |
| 6,198,172 B1 | 3/2001 | King et al. | |
| 6,201,304 B1 | 3/2001 | Moden | |
| 6,208,156 B1 | 3/2001 | Hembree | |
| 6,212,767 B1 | 4/2001 | Tandy | |
| 6,214,716 B1 | 4/2001 | Akram | |
| 6,225,689 B1 | 5/2001 | Moden et al. | |
| 6,232,666 B1 | 5/2001 | Corisis et al. | |
| 6,235,554 B1 | 5/2001 | Akram et al. | |
| 6,239,489 B1 | 5/2001 | Jiang | |
| 6,247,629 B1 | 6/2001 | Jacobson et al. | |
| 6,255,833 B1 | 7/2001 | Akram et al. | |
| 6,258,623 B1 | 7/2001 | Moden et al. | |
| 6,258,624 B1 | 7/2001 | Corisis | |
| 6,259,153 B1 | 7/2001 | Corisis | |
| 6,261,865 B1 | 7/2001 | Akram | |
| 6,265,766 B1 | 7/2001 | Moden | |
| 6,281,042 B1 | 8/2001 | Ahn et al. | |
| 6,281,577 B1 | 8/2001 | Oppermann et al. | |
| 6,285,204 B1 | 9/2001 | Farnworth | |
| 6,294,839 B1 | 9/2001 | Mess et al. | |
| 6,297,547 B1 | 10/2001 | Akram | |
| 6,303,981 B1 | 10/2001 | Moden | |
| 6,326,698 B1 | 12/2001 | Akram | |
| 6,329,222 B1 | 12/2001 | Corisis et al. | |
| 6,331,221 B1 | 12/2001 | Cobbley | |
| 6,429,528 B1 | 8/2002 | King et al. | |
| 6,437,586 B1 | 8/2002 | Robinson | |
| 6,483,044 B1 | 11/2002 | Ahmad | |
| 6,548,376 B2 | 4/2003 | Jiang | |
| 6,552,910 B1 | 4/2003 | Moon et al. | |
| 6,560,117 B2 | 5/2003 | Moon et al. | |
| 6,607,937 B1 | 8/2003 | Corisis | |
| 6,614,092 B2 | 9/2003 | Eldridge et al. | |
| 6,650,013 B2 | 11/2003 | Yin et al. | |
| 6,975,035 B2 | 12/2005 | Lee | |
| 7,180,149 B2 | 2/2007 | Yamamoto et al. | |
| 7,517,790 B2 | 4/2009 | Fitzsimmons et al. | |
| 7,727,872 B2 | 6/2010 | Wood et al. | |
| 2001/0038144 A1* | 11/2001 | Grigg | 257/698 |
| 2002/0041027 A1 | 4/2002 | Sugizaki | |
| 2002/0155728 A1 | 10/2002 | Khandros et al. | |
| 2003/0062631 A1 | 4/2003 | Nemoto | |
| 2003/0080428 A1 | 5/2003 | Izumitani et al. | |
| 2003/0151139 A1 | 8/2003 | Kimura | |
| 2004/0125579 A1 | 7/2004 | Konishi et al. | |
| 2005/0098605 A1 | 5/2005 | Edelstein et al. | |
| 2005/0104171 A1 | 5/2005 | Benson et al. | |
| 2005/0104228 A1 | 5/2005 | Rigg et al. | |
| 2005/0127478 A1 | 6/2005 | Hiatt et al. | |
| 2005/0167850 A1 | 8/2005 | Moden | |
| 2005/0253245 A1 | 11/2005 | Lynch et al. | |
| 2005/0287783 A1 | 12/2005 | Kirby et al. | |
| 2006/0108666 A1 | 5/2006 | Koizumi | |
| 2006/0261340 A1 | 11/2006 | Farnworth et al. | |
| 2007/0045797 A1 | 3/2007 | Lee et al. | |
| 2007/0105272 A1 | 5/2007 | Lee et al. | |
| 2008/0303132 A1 | 12/2008 | Mohammed et al. | |
| 2011/0252623 A1 | 10/2011 | Lee et al. | |

FOREIGN PATENT DOCUMENTS

| | | |
|---|---|---|
| JP | 2001308122 A | 11/2001 |
| JP | 2002107382 A | 4/2002 |
| JP | 2002118198 A | 4/2002 |
| JP | 2002-261194 | 9/2002 |

(56) References Cited

FOREIGN PATENT DOCUMENTS

| | | | |
|---|---|---|---|
| JP | 2003017495 | A | 1/2003 |
| JP | 2003174120 | A | 6/2003 |
| JP | 2004281982 | A | 10/2004 |
| JP | 2005101067 | A | 4/2005 |
| JP | 2006156436 | A | 6/2006 |

OTHER PUBLICATIONS

Search Report and Written Opinion for Singapore Application No. 200505410-1, 15 pages, mailed Feb. 6, 2007.
Communication pursuant to Article 94(3) EPC, EP Application No. 06801402.6, Sep. 26, 2008.
Office Action issued Feb. 23, 2010 in Korea Application No. 10-2008-7006163.
Office Action issued Oct. 22, 2008 in R.O.C. (Taiwan) Application No. 095130920.
Office Action issued Aug. 6, 2010 in U.S. Appl. No. 11/617,567.
Office Action issued Feb. 8, 2011 in Japan Application No. 2008-527969, 8 pages.
Office Action issued Aug. 2, 2011 in Japan Application No. 2008-527969, 11 pages.
Office Action issued Mar. 6, 2012 in Japan Application No. 2008-527969, 6 pages.
Office Action issued May 18, 2012 in European Application No. 06801402.6, 4 pages.

* cited by examiner

MICROELECTRONIC DEVICES AND MICROELECTRONIC SUPPORT DEVICES, AND ASSOCIATED ASSEMBLIES AND METHODS

CROSS-REFERENCE TO RELATED APPLICATIONS

This application is a divisional of U.S. application Ser. No. 13/171,137 filed Jun. 28, 2011, now U.S. Pat. No. 8,778,732, which is a divisional of U.S. application Ser. No. 11/617,567 filed Dec. 28, 2006, now U.S. Pat. No. 7,968,369, which is a divisional of U.S. application Ser. No. 11/218,256 filed Sep. 1, 2005, which claims foreign priority benefits of Republic of Singapore Application No. 200505410-1 filed Aug. 24, 2005, now Republic of Singapore Patent No. 130061, each of which is incorporated herein by reference in its entirety.

TECHNICAL FIELD

Embodiments of the present invention relate to microelectronic devices, associated assemblies, and associated methods, including microelectronic devices having a microfeature workpiece and/or a support member with one or more recessed contact(s).

BACKGROUND

Semiconductor chips or dies are typically manufactured from a semiconductor material such as silicon, germanium, or gallium/arsenide. The dies also typically include terminals to facilitate electrical connection of the die with another electrical component. One common package design includes a semiconductor die attached to a small circuit board, e.g., via an adhesive. Some or all of the terminals of the semiconductor die may then be electrically connected to a first set of contacts of the board, e.g., by wire bonding and/or flip chip technology. At least a portion of the connected board and die may then be encapsulated in a sealing compound to add structural integrity and/or protect portions of the die and board from environmental factors. Often a second set of contacts carried on an outer surface of the board remain exposed. These exposed contacts are electrically connected to the first contacts, allowing the features of the semiconductor die to be electrically accessed.

FIG. 1 schematically illustrates a conventional die and circuit board assembly 1. This assembly 1 includes a semiconductor die 10 having a top surface 22a and a bottom surface 22b. The bottom surface 22b is attached via an adhesive 46 to a circuit board 40. The first surface 22a of the die 10 includes multiple terminals 30, which are used to electrically connect the die 10 to contact pads 42 on the circuit board 40 using wires 44. Typically, dies 10 are manufactured using an etching process (e.g., isotropic etching) and the terminals 30 are distributed across the first surface 22a of the die 10 providing a two-dimensional array of terminals 30.

As semiconductor dies 10 are made smaller, it can be necessary to make the terminals 30 smaller and/or decrease the pitch of the terminals 30 (e.g., reduce the distance between the centers of the terminals 30). Because of limitations on the etching process (e.g., the accuracy or precision of the process), the effective bonding area of the terminals 30 can be greatly reduced when decreasing the size and/or decreasing the pitch of the terminals 30. The same size/pitch limitations occur on circuit boards 40, as the size of the circuit boards 40 is reduced. For example, the spacing required between the contact pads 42 on the circuit board 40 to provide structural support and to ensure proper physical and electrical separation between the contact pads 42 in a two-dimensional array can reduce the effective bonding area to 58 microns for a contact pad pitch of 140 microns. In many cases this effective bonding area is too small to bond the wires 44 to the contact pads 42 and a larger effective bonding area is desirable. A solution to these kinds of reduction in effective bonding area is to replace the etching process with a semi-additive process for producing circuit boards 40 and/or an RDL process for producing dies 10. These processes, however, are more complex and more expensive than the etching processes currently used.

DETAILED DESCRIPTION

A. Introduction

Figure 1:
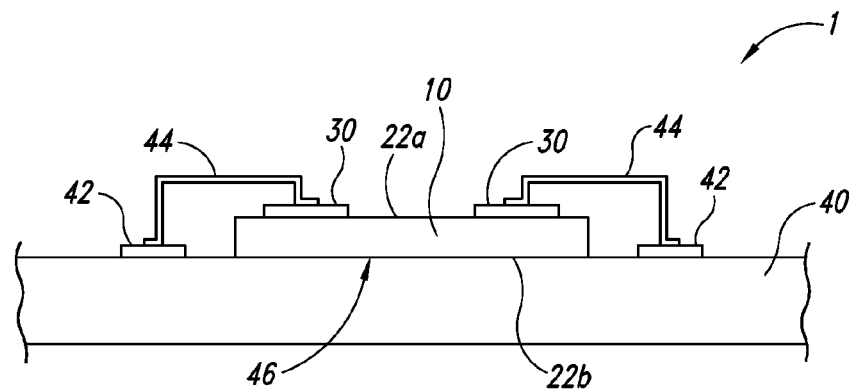
FIG. 1 is a partially schematic illustration of a conventional die and circuit board assembly in accordance with the prior art.

The present invention is directed toward microelectronic devices, and associated assemblies and methods. For example, certain aspects of the invention are directed toward a microelectronic device that includes a microfeature workpiece having a side and an aperture in the side. The device can further include a workpiece contact having a surface, with at least a portion of the surface of the workpiece contact accessible through the aperture and through a passageway extending between the aperture and the surface.

Other aspects of the invention are directed toward a microelectronic device that includes a microfeature workpiece having a first side, a second side, and a passageway. The passageway can extend through the microfeature workpiece between a first aperture in the first side and a second aperture in the second side. The device can further include a workpiece contact having a first surface and a second surface. The workpiece contact can be carried by the second side and can be positioned to cover at least a portion of the second aperture. The workpiece contact can also be electrically coupled to an element of the microelectronic device. At least a portion of the first surface of the workpiece contact can be positioned to be accessible through the first aperture and the passageway.

Still other aspects of the invention are directed toward a microelectronic device assembly that includes a support member having a first support contact and a second support contact. The assembly can further include a first connector, a second connector, and a microfeature workpiece having a first side and a second side opposite the first side. The assembly can still further include a first workpiece contact carried by the first side of the microfeature workpiece. The first workpiece contact can be connected to the first support contact via the first connector. The assembly can yet further include a second workpiece contact carried by the microfeature workpiece. The second workpiece contact can be recessed from the first side and can be connected to the second support contact via the second connector.

Yet other aspects of the invention are directed toward a microelectronic device assembly that includes a support member having a support contact, a connector, and a microfeature workpiece having a side and an aperture in the side. The assembly can further include a workpiece contact having a surface. The surface of the workpiece contact can be connected to the support contact via the connector. The connector can extend through the aperture and through a passageway that extends between the aperture and the surface.

Still other aspects of the invention are directed toward a method for making a microelectronic device that includes positioning a workpiece contact to be recessed from a side of a microfeature workpiece. The method can further include creating a passageway extending between an aperture in the side of the microfeature workpiece and a surface of the workpiece contact. The surface of the workpiece contact can be accessible through the aperture in the side of the microfeature workpiece and the passageway.

Yet other aspects of the invention are directed toward a method of making a microelectronic device assembly that includes positioning a workpiece contact to be recessed from a side of a microfeature workpiece. The method can further include creating a passageway extending between an aperture in the side of the microfeature workpiece and a surface of the workpiece contact. The method can still further include connecting the surface of the workpiece contact to a support contact of a support member with a connector. The connector can extend through the aperture and through the passageway.

Still other aspects of the invention are directed toward a microelectronic support device that includes a support member having a first side, a second side, and a passageway extending through the support member between a first aperture in the first side and a second aperture in the second side. The device can further include a support contact having a first surface and a second surface. The support contact can be carried by the second side and can be positioned to cover at least a portion of the second aperture. At least a portion of the first surface of the support contact can be positioned to be accessible through the first aperture and the passageway.

Yet other aspects of the invention are directed toward a microelectronic support device that includes a support member having a side and a support contact carried by the side of the support member. The support contact can be connectable to a workpiece contact of a microfeature workpiece via a connector. The device can further include recessed support contact means carried by the support member. The recessed support contact means can be connectable to a second workpiece contact of the microfeature workpiece via a bond wire.

Still other aspects of the invention are directed toward a microelectronic device assembly that includes a microfeature workpiece having a first workpiece contact and a second workpiece contact. The assembly can further include a connector, a bond wire, a support having a side, and a first support contact carried by the side of the support. The first support contact can be connected to the first workpiece contact via the first connector. The assembly can further include a second support contact carried by the support and recessed from the first side. The second support contact can be connected to the second workpiece contact via the bond wire.

Yet other aspects of the invention can include a microelectronic device assembly that includes a microfeature workpiece having a first workpiece contact and a second workpiece contact. The assembly can further include a connector, a bond wire, a support member having a side, and a support contact carried by the side of the support member. The support contact can be connected to the first workpiece contact by the connector. The assembly can further include recessed support contact means carried by the support member. The recessed support contact means can be connected to the second workpiece contact via the bond wire.

Still other aspects of the invention are directed toward a method for making a microelectronic support device that includes positioning a support contact to be recessed from a side of a support member. The method can further include creating a passageway extending between an aperture in the side of the support member and a surface of the support contact. The surface of the support contact can be accessible through the aperture and the passageway.

Yet other aspects of the invention are directed toward a method of making a microelectronic device assembly that includes positioning a support contact to be recessed from a side of a support member. The method can further include creating a passageway extending between an aperture in the side of the support member and a surface of the support contact. The method can still further include connecting the surface of the support contact to a workpiece contact of a microfeature workpiece with a bond wire extending through the aperture and through the passageway.

As used herein, the terms "microfeature workpiece" and "workpiece" refer to substrates that are used to form microelectronic devices. Typical microdevices include microelectronic circuits or components, thin-film recording heads, data storage elements, microfluidic devices, and other products. Micromachines and micromechanical devices are included within this definition because they are manufactured using much of the same technology that is used in the fabrication of integrated circuits. The substrates can be semiconductive pieces (e.g., doped silicon wafers or gallium arsenide wafers), non-conductive pieces (e.g., various ceramic substrates), or conductive pieces. In some cases, the workpieces are generally round, and in other cases the workpieces have other shapes, including rectilinear shapes. The workpieces can include flexible tape and/or rigid substrates.

Figure 3:
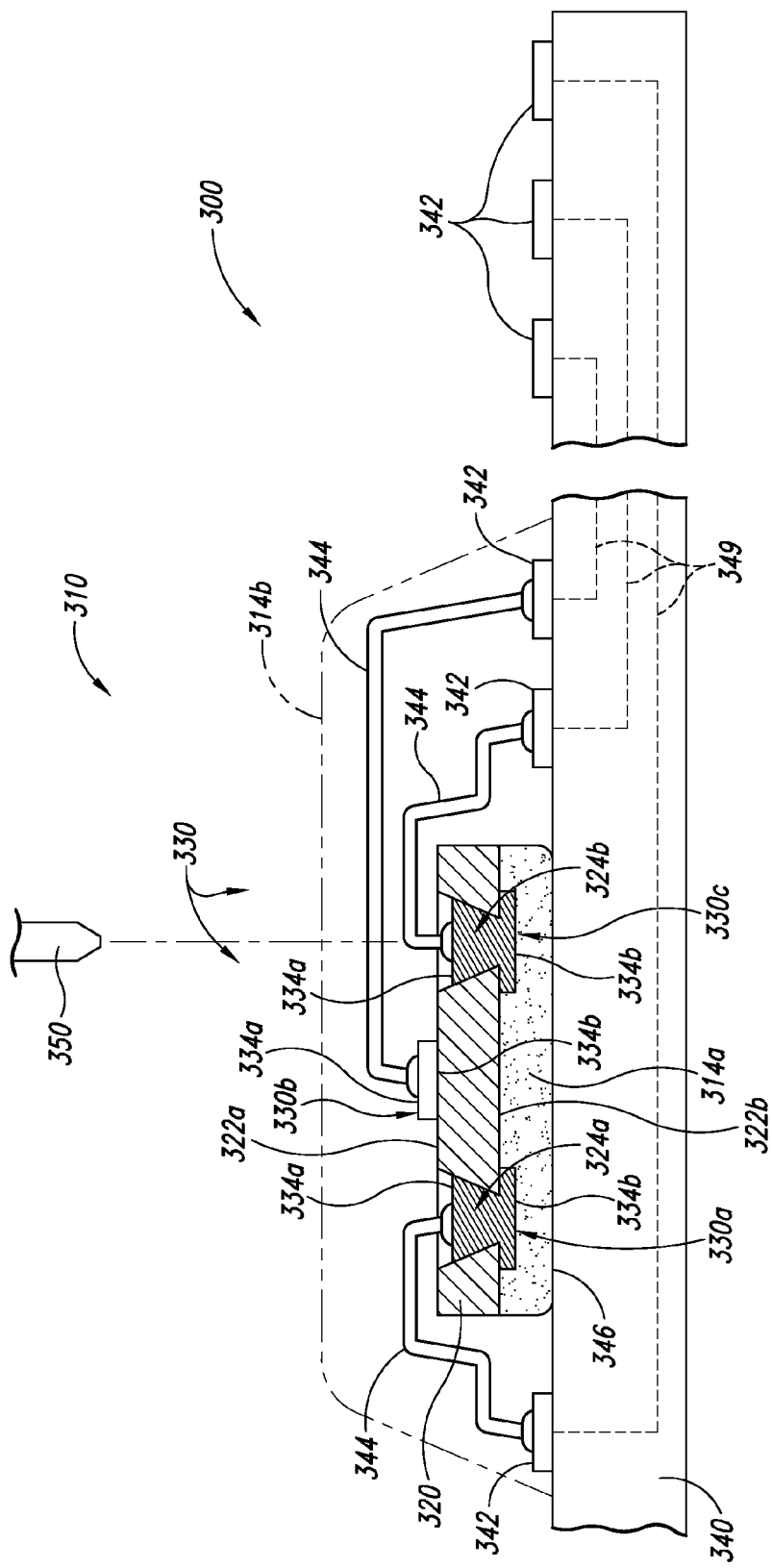
FIG. 3 is a partially schematic cross-sectional illustration of a microelectronic device assembly in accordance with other embodiments of the invention.
Figure 4:
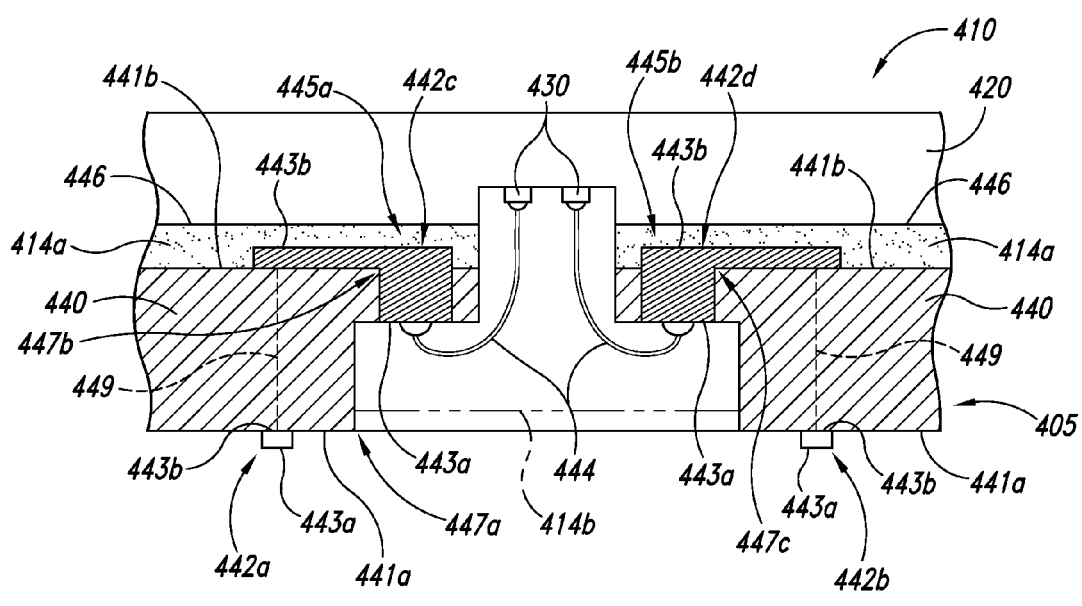
FIG. 4 is a partially schematic cross-sectional illustration of a microelectronic device assembly in accordance with still other embodiments of the invention.

Several specific details of the invention are set forth in the following description and in FIGS. 2A-4 to provide a thorough understanding of certain embodiments of the invention. For example, FIGS. 2A-2D illustrate the formation of a microelectronic device or a microelectronic support device that has a three-dimensional array of contacts. In certain embodiments, the three-dimensional array of contacts can overcome the pitch limitations associated with the two-dimensional arrays of conventional dies and/or circuit boards produced using an etching process (e.g., as discussed with reference to FIG. 1). FIG. 3 is an illustration of a microelectronic device assembly having a microelectronic device with a three-dimensional array of workpiece contacts in accordance with other embodiments of the invention. FIG. 4 is an illustration of a support member having a three-dimensional array of support contacts in accordance with still other embodiments of the invention. One skilled in the art, however, will understand that the present invention may have additional embodiments, and that other embodiments of the invention may be practiced without several of the specific features described below.

B. Microelectronic Devices and Associated Methods

Figure 2A:
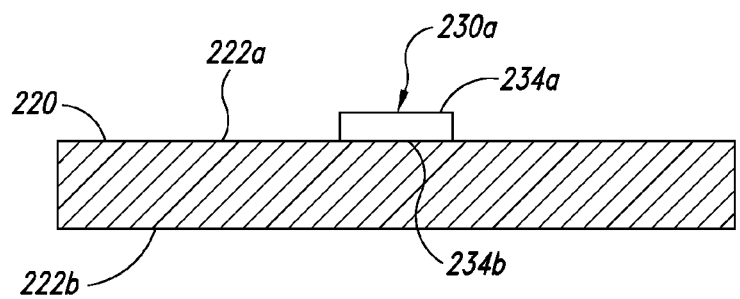
FIG. 2A is a partially schematic cross-sectional view of a microfeature workpiece during the formation process of a microelectronic device in accordance with embodiments of the invention.

FIG. 2A is a partially schematic cross-sectional view of a microfeature workpiece during the formation process of a microelectronic device in accordance with embodiments of the invention. For the purpose of illustration, the formation of the microelectronic device will be discussed in terms of a microfeature workpiece, however, one skilled in the art will understand that this process can apply equally to a the formation of one or more contacts on a microelectronic support device and/or a support member, as discussed in greater detail with reference to FIG. 4. The microfeature workpiece 220 includes a first side to 222a and a second side 222b. In the illustrated embodiment, the first and second sides 222a, 222b are positioned opposite one another and a first workpiece contact 230a is carried by the first side 222a. The first workpiece contact 230a includes a first surface 234a and a second surface 234b. In FIG. 2A, the second surface 234b of the first workpiece contact 230a is mounted or coupled to the first side 222a of the microfeature workpiece 220 and the first surface 234a is accessible.

Figure 2B:
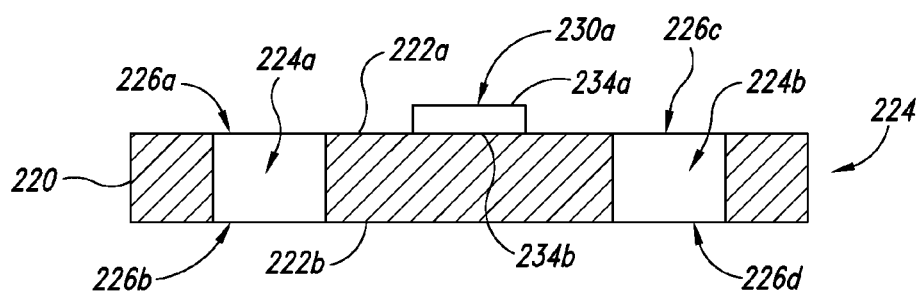
FIG. 2B is a partially schematic cross-sectional view of the microfeature workpiece, shown in FIG. 2A, with two passageways extending between a first surface of the microfeature workpiece and a second surface of the microfeature workpiece.

In FIG. 2B two passageways 224 have been formed in the microfeature workpiece 220, shown as a first passageway 224a and a second passageway 224b. The first passageway extends between a first aperture 226a in the first side 222a and a second aperture 226b in the second side 222b. The second passageway 224b extends between a third aperture 226c in the first side 222a and a fourth aperture 226d in the second side 222b. The passageways 224 can be formed by laser drilling (e.g., laser punching) the microfeature workpiece 220 or by using other methods well known in the art (e.g., etching, semi-additive, build-up, and/or mechanical punching techniques).

Figure 2C:
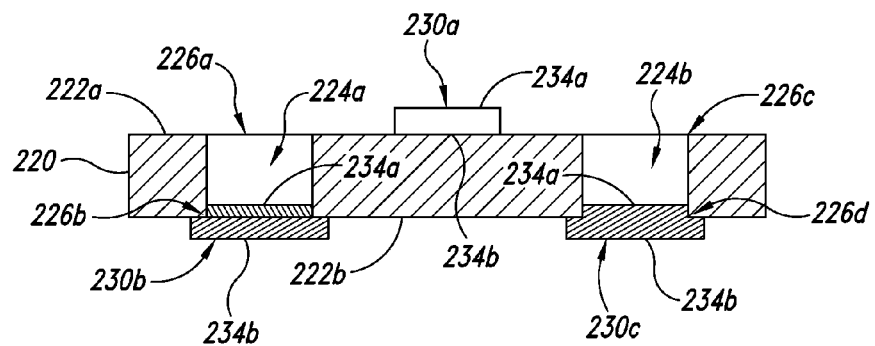
FIG. 2C is a partially schematic cross-sectional view of the microfeature workpiece, shown in FIG. 2B, with two workpiece contacts positioned proximate to the second surface of the microfeature workpiece.

In FIG. 2C, a second workpiece contact 230b and a third workpiece contact 230c have been added to the microfeature workpiece. The second workpiece contact 230b can include a first surface 234a and a second surface 234b, and can be recessed from the first side 222a of the microfeature workpiece 220. In the illustrated embodiment, the second workpiece contact 230b is positioned proximate to the second aperture 226b so that at least a portion of the first surface 234a of the second workpiece contact 230b is accessible through the first aperture 226a and the first passageway 224a. For example, the second workpiece contact 230b can be carried by or on the second side 222b so that the second workpiece contact 230b partially or fully covers the second aperture 226b. In the illustrated embodiment, a portion of the first surface 234a of the second workpiece contact 230b is mounted to (e.g., formed in, formed on, attached to, coupled to, supported by, and/or connected to) the second side 222b of the microfeature workpiece 220 so that the second aperture 226b is fully covered.

The third workpiece contact 230c can have a first surface 234a and a second surface 234b, and can be carried by the microfeature workpiece 220. In the illustrated embodiment, the third workpiece contact 230c can be carried proximate to the fourth aperture 226d in a manner generally similar to the placement of the second workpiece contact 230b relative to the second aperture 226b. Accordingly, at least a portion of the first surface 234a of the third workpiece contact 230c can be accessible through a third aperture 226c and a second passageway 224b.

Figure 2D:
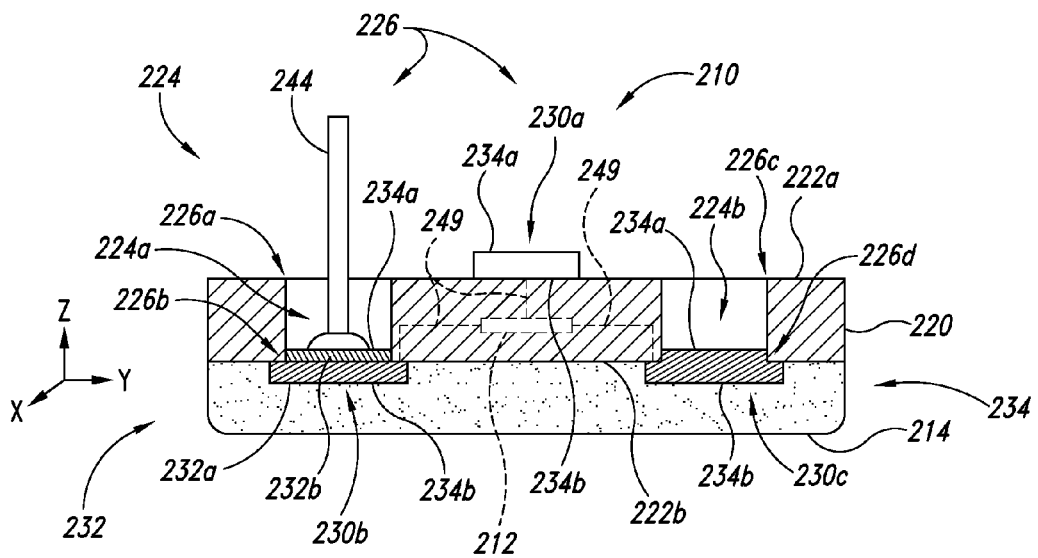
FIG. 2D is a partially schematic cross-sectional view of the completed microelectronic device that includes the microfeature workpiece shown in FIGS. 2A-2C.

FIG. 2D is a partially schematic cross-sectional view of a completed microelectronic device 210 (e.g., a digital signal processor, logic chip, DRAM, flash memory, or processor) that includes the microfeature workpiece 220 discussed above with reference to FIGS. 2A-2C. In the illustrated embodiment, the first, second, and third workpiece contacts 230a, 230b, 230c (referred to collectively as workpiece contacts 230) can be coupled or connected to at least one other element 212 (e.g., electronic elements) carried by the microfeature workpiece 220. In the illustrated embodiment, the workpiece contacts 230 are coupled to the other element 212 via signal pathways 249 (e.g., wires or integrated circuitry). In other embodiments, one or more of the workpiece contacts 230 can be directly connected to the other element 212 without an intervening signal path 249.

The workpiece contacts 230 can be used to connect or couple the microelectronic device 210 to external components (e.g., a support member external to the microelectronic device 210). In the illustrated embodiment, a portion of a connector 244 (e.g., a bond wire) is shown coupled, attached, or connected to the first surface 234a of the second workpiece contact 230b. The connector 244 extends through at least a portion of the first passageway 224a and out of the first aperture 226a where it can be connected to another component external to the microelectronic device 210.

A protective material 214 (e.g., a dielectric material, encapsulant, epoxy, and/or resin) can be used to cover or encase portions of the microelectronic device 210, including portions of the microfeature workpiece 220, portions of the workpiece contacts 230, and portions of the elements 212. In various embodiments, the protective material 214 can provide structural integrity and/or protect portions of the microelectronic device 210 from environmental conditions (e.g., moisture, dust, and/or electromagnetic radiation). For example, in the illustrated embodiment the second surface 234b of the second workpiece contact 230b, and the second surface 234b of the third workpiece contact 230c are encased in the protective material 214 along with other portions of the microfeature workpiece 220.

Additionally, the workpiece contacts 230 can be made from various materials and include one or more portion(s). For example, in the illustrated embodiment the second workpiece contact 230b includes two portions, shown as a first portion 232a and a second portion 232b. In certain embodiments, the first portion 232a can include different materials than the second portion 232b. For example, in one embodiment the first portion 232a can be made from copper and the second portion 232b can have a nickel-gold composition (e.g., the second portion 232b can include a layer of soft gold over nickel that prevents oxidation and facilitates connectivity to the connector 244). In the illustrated embodiment, the first and third workpiece contacts 230a, 230c include single portions (e.g., single portions made from a copper material). In other embodiments, the workpiece contacts 230 can include other materials based on the desired workpiece contact characteristics (e.g., the desired conductive, protective, and/or connective properties).

By distributing the workpiece contacts 230 between the first and second sides 222a, 222b, the workpiece contacts 230 are distributed in three dimensions (e.g., along the X, Y, and Z axes), however, in the illustrated embodiment all of workpiece contacts 230 are accessible from the first microfeature workpiece side 222a. This can allow the workpiece contacts 230 to be spaced closer together with respect to the X and Y axes than when the workpiece contacts 230 are carried in a two-dimensional array (e.g., as shown in FIG. 1). For example, because the workpiece contacts 230 can be staggered between the first and second sides 222a, 222b, the surface area of the microfeature workpiece 220 required to structurally support the workpiece contacts 230 can also be distributed between the first and second sides 222a, 222b. This can allow peripheral, non-bonding portions of the workpiece contacts 230 (e.g., portions of the workpiece contacts 230 which are only used to structurally support the workpiece contacts 230) carried on different surfaces to be placed closer together relative to the X and Y axes or even overlap one another.

Additionally, placing the workpiece contacts 230 in a three-dimensional array also allows vertical spacing to be used to provide physical and electrical separation between the workpiece contacts 230. Furthermore, laser drilling techniques can be used to precisely place the first and second passageways 224a, 224b, allowing the workpiece contacts 230 to be closely placed with respect to the X and Y axes. Accordingly, more workpiece contacts 230, having a desired effective bonding area, can be placed in a given area using the three-dimensional array than can be done using the two-dimensional arrays of conventional dies produced using an etching process (e.g., as shown in FIG. 1). In certain embodiments, the three-dimensional array shown in FIG. 2D can allow three workpiece contacts 230, with usable effective bonding areas, to be accessible via the same surface area that is required to carry two workpiece contacts 230 in the two-dimensional array used on conventional dies. For example, in certain embodiments the three-dimensional array can allow a workpiece contact pitch of less than 140 microns while maintaining suitable workpiece contact bonding areas.

Accordingly, a feature of some of the embodiments described above is that a larger number of workpiece contacts, with suitable bonding areas, can be accessible from a specified area on a single side of a microelectronic device as compared to a conventional die having a two-dimensional array produced using an etching process (as shown in FIG. 1). Additionally, this larger number of workpiece contacts can be achieved without resorting to more complex and/or more costly processes (e.g., semi-additive or RDL processes). Accordingly, an advantage of this feature is that microelectronic devices can be made smaller without resorting to these more complex or costly production techniques and without reducing the number of available workpiece contacts.

The embodiments of the microelectronic device 210 and associated methods discussed above with reference to FIGS. 2A-2D can be modified in additional embodiments of the invention. For example, in other embodiments the microfeature workpiece 220 can include more, fewer, or different arrangements of surfaces, passageways 224, other elements 212, and/or apertures 226. For instance, in certain embodiments the passageway(s) 224 can be tapered. For example, in one embodiment the second aperture 226b can be smaller than the first aperture 226a and the first passageway 224a can include a monotonic taper between the first and second apertures 226a, 226b. In still other embodiments, the microelectronic device 210 can include more or fewer workpiece contacts 230.

In yet other embodiments, the workpiece contacts can have more or fewer workpiece contact portions 232, more surfaces 234, and/or other arrangements. For example, although in the illustrated embodiment the second and third workpiece contacts 230b, 230c cover and extend through the corresponding apertures into the corresponding passageways 224, in other embodiments the second and/or third workpiece contacts 230b, 230c do not extend through the corresponding aperture(s) 226. For instance, in one embodiment, the first surface 234a of the second workpiece contact 230b and the first surface 234a of the third workpiece contact 230c are positioned to be flush with, and to cover, the second and fourth apertures 226b, 226d, respectively. In still other embodiments, some of the workpiece contact(s) 230 can be recessed from the first side 222a of the microfeature workpiece 220 and accessible from the first side through passageway(s) 224, but the recessed workpiece contacts are positioned away from the second side 222b of the microfeature workpiece 220 (e.g., the recessed workpiece contacts 230 can be positioned internally in the microfeature workpiece 220). In yet other embodiments, the microelectronic device 210 includes other arrangements of protective material(s) or does not include any protective material.

As discussed above, the concepts, processes, and apparatuses discussed above with reference to FIGS. 2A-2D apply equally to support members having recessed contacts. For example, in other embodiments the workpiece contacts 230 can be replaced with support contacts and can be coupled to a support member instead of the microfeature workpiece 220 to form a microelectronic support device having recessed support contacts. Additionally, support members and/or microelectronic supports having one or more recessed contacts, can have advantages similar to those discussed above with reference to FIGS. 2A-2D.

C. Microelectronic Device Assemblies and Associated Methods

FIG. 3 is a partially schematic cross-sectional illustration of a microelectronic device assembly 300 with a microelectronic device 310 operatively or electrically coupled to a support member 340 in accordance with embodiments of the invention. In the illustrated embodiment, a microelectronic device 310 similar to the microelectronic device discussed with reference to FIGS. 2A-2D is structurally coupled to the support member (e.g., by an adhesive 346). The microelectronic device 310 includes a microfeature workpiece 320 and three workpiece contacts positioned in a three-dimensional array, shown as a first workpiece contact 330a, a second workpiece contact 330b, and a third workpiece contact 330c (e.g., referred to collectively as workpiece contacts 330). Each workpiece contact 330 includes a first surface 334a and a second surface 334b.

In the illustrated embodiment, the microfeature workpiece 320 includes a first side 322a and a second side 322b, and the first workpiece contact 330a is carried by the first side 322a. In FIG. 3, the second and third workpiece contacts 330b, 330c are positioned proximate to the second side 322b. Additionally, the second and third workpiece contacts 330b, 330c are positioned so that at least a portion of the first surface 334a of the second workpiece contact 330b is accessible through a first passageway 324a and at least a portion of the first surface 334a of the third workpiece contact 330c is accessible through a second passageway 324b.

In the illustrated embodiment, the first and second passageways 324a, 324b are tapered and the second and third workpiece contacts 330b, 330c have been configured to extend through at least a portion of their respective passageway 324a, 324b (e.g., the second and third workpiece contacts 330b, 330c can be "plated up" using electrostatic plating). Accordingly, because the second and third workpiece contacts 330b, 330c extend partially through the first and second tapered passageways 324a, 324b the effective bonding area can be increased and/or the bonding depth (e.g., the depth a connector 344 must extend into the first and second passageways 324a, 324b) can be reduced. In certain embodiments, a first protective material 314a can cover at least a portion of the microfeature workpiece 320, the second surface 334b of the second workpiece contact 330b, and/or the second surface 334b of the third workpiece contact 330c to provide structural integrity and/or protection from the environment.

In the illustrated embodiment, connectors 344 (e.g., bonding wires or solder balls) can electrically couple the workpiece contacts 330 of the microelectronic device 310 to support contacts 342 of the support member 340. For example, a capillary 350 (e.g., a slimline bottle capillary, which is well known in the art) can be partially inserted into the second passageway 324b and a connector 344 (e.g., a wire comprised of gold) can be fed through the capillary and bonded to the third workpiece contact 330c. For example, a capillary 350 with a tip having tapered sides (e.g., sides with a ten degree taper) can be inserted partially into the second passageway 324b and a connector 344 can be fed though the capillary 350 to impact an end of the connector 344 against the first surface 334a of the third workpiece contact 330c. By managing the amount the capillary is inserted into the second passageway 324b and the impact force of the end of the connector 344 against the third workpiece contact 330c, a desired mashed ball height and mashed ball diameter can be obtained. Additionally, thermal and/or ultrasonic energy can be used to complete the bonding process. In certain embodiments, a molten ball can be formed on the end of the connector 344 before the end of the connector 344 is forced against the third workpiece contact 330c by the capillary 350. In any case, an opposite end of the connector 344 can then be coupled or bonded to a support contact 342 of the support member 340 in a similar manner or using other techniques. The first and second workpiece contacts 330a, 330b can also be coupled to support contacts 342 of the support member 340 in a manner similar to that used with the third workpiece contact 330c or by using other processes.

The support member 340 can be flexible or rigid and can have any desired configuration. For example, the support member 340 (e.g., a printed circuit board) can be made with ceramic, silicon, glass, and/or organic material(s). Additionally, the support member 340 can include signal paths 349 and additional support contacts 342 that can be used to electrically connect the microelectronic device 310 to other components carried by the support member 340 or external to the support member 340. In certain embodiments, once the workpiece contacts 330 of the microelectronic device 310 are coupled to the respective support contacts 342 of the support member 340, a second protective material 314b can be placed over at least a portion of the microelectronic device 310 and/or at least a portion of the support structure 340 to provide structural integrity and/or protection from the environment.

As discussed above with reference to FIGS. 2A-2D, the microelectronic device 310 of the microelectronic device assembly 300 can have a larger number of workpiece contacts (with suitable bonding areas) that are accessible from a specified area on a single side of the microfeature workpiece of the device as compared to a conventional die having a two-dimensional array produced using an etching process (as shown in FIG. 1). Additionally, this larger number of workpiece contacts can be provided without resorting to more complex and/or expensive manufacturing processes. Thus, as described above with respect to FIGS. 2A-2D, an advantage of this feature is that microelectronic devices can be made smaller without resorting to these more complex or costly production techniques and without reducing the number of available workpiece contacts. This in turn, can allow microelectronic device assemblies to be made smaller and/or more microelectronic devices to be mounted to a support member. Smaller microelectronic device assemblies can allow electronic devices to be made smaller and/or more powerful (e.g., a computer can be made smaller with more processing capability).

The embodiments of the microelectronic device assembly 310 and associated methods discussed above with reference to FIG. 3 can be modified in additional embodiments of the invention. For example, although in the illustrated embodiment an adhesive 346 is used to structurally couple the microelectronic device 310 to the support member 340, in other embodiments the microelectronic device 310 can be coupled to the support member 340 via other methods (e.g., via screw(s) and/or clip(s)). In still other embodiments, the microelectronic device assembly 300 includes different arrangements of first and second protective materials 314a, 314b, more protective materials, or does not include a first and/or second protective material 314a, 314b. In yet other embodiments, the first and second passageways 324a, 324b can be untapered or have a different tapered arrangement (e.g., tapered in two directions). In still other embodiments, the microelectronic device assembly 310 can have various arrangements, for example, the microelectronic device assembly 310 can have a board on chip or a chip on board configuration.

In still other embodiments, the workpiece contacts 330 of the microelectronic device 310 can be coupled to the support contacts 342 of the support member 340 using other techniques. For example, in other embodiments the capillary 350 is used to bond the connectors 344 to the second and third workpiece contacts 330b, 330c, but the capillary 350 is not inserted into the first or second passageway 324a, 324b. In still other embodiments, a molten ball is formed on the end of the connector 344 and the connector 344 is bonded to one of the workpiece contacts 330 without using a capillary 350. In yet other embodiments, other bonding techniques well known in the art are used to electrically couple or connect the workpiece contacts 330 of the microelectronic device 310 to the support contacts 342 of the support structure 340 (e.g., thermal, ultrasonic, and/or flip chip technologies).

As discussed above, in other embodiments a support member can include one or more recessed contacts. Accordingly, FIG. 4 is a partially schematic cross-sectional illustration of a microelectronic device assembly 400 with a microelectronic device 410 having a microfeature workpiece 420 operatively or electrically coupled to a microelectronic support device 405 having a support member 440 in accordance with embodiments of the invention. The support member 440 includes four support contacts positioned in a three-dimensional array, shown as a first support contact 442a, a second support contact 442b, a third support contact 442c, and a fourth support contact 442d (e.g., referred to collectively as support contacts 442). Each support contact 442 includes a first surface 443a and a second surface 443b.

In the illustrated embodiment, the support member 440 includes a first side 441a and a second side 441b, and the first and second support contacts 442a, 442b are carried by the first side 441a. In FIG. 4, the third and fourth support contacts 442c, 442d are positioned proximate to the second side 441b, with a first passageway 445a and a second passageway 445b, respectively. Additionally, the third and fourth support contacts 442c, 442d are positioned to be recessed from the first surface or side 441a. For example, in the illustrated embodiment the first passageway 445a extends between a first aperture 447a in the first side 441a of the support member 440 to a second aperture 447b in the second side 441b of the support member 440 and the second passageway 445b extends between the first aperture 447a and a third aperture 447c in the second side 441b of the support member 440. In FIG. 4, the third support contact 442c is located proximate to the second aperture 447b (e.g., covering at least a portion of the second aperture 447b) and extends at least partway through the second aperture 447b and the first passageway 445a so that at least a portion of the first surface 443a of the third support contact 442c is accessible through the first aperture 447a. Similarly, in the illustrated embodiment, the fourth support contact 442d is located proximate to third aperture 447c and extends at least partway through the third aperture 447c and the second passageway 445b so that at least a portion of the first surface 443a of the fourth support contact 442d is accessible through the first aperture 447a.

In other embodiments, the passageways 445 and/or support contacts 442 can be tapered, as discussed above with reference to FIG. 3. In other embodiments, a first protective material 414a can cover at least a portion of the support member 440, the second surface 443b of the third support contact 442c, and/or the second surface 443b of the fourth support contact 442d to provide structural integrity and/or protection from the environment.

In the illustrated embodiment, bond wires 444 can electrically couple the workpiece contacts 430 of the microelectronic device 410 to the third and fourth support contacts 442c, 442d. For example, a capillary (discussed above with reference to FIG. 3) can be partially inserted through the first aperture 447a to bond or connect the bond wire to the support contacts 442 and/or the workpiece contacts 430. In other embodiments, other bonding processes can be used.

The microelectronic support device 405 can be flexible or rigid and can have any desired configuration. For example, the microelectronic support device 405 (e.g., a printed circuit board) can be made with ceramic, silicon, glass, and/or organic material(s). Additionally, the microelectronic support device 405 can include other elements. For example, in the illustrated embodiment the microelectronic support device 405 includes signal paths 449 that connect the first and second support contacts 443a, 443b to the third and fourth support contacts 443c, 443d respectively. The first and second support contacts can be used to electrically connect the microelectronic support device 405 to other components carried by the microelectronic support device 405 or external to the microelectronic support device 405.

In certain embodiments, once the workpiece contacts 430 of the microelectronic device 410 are coupled to the third and fourth support contacts 442c, 442d, a second protective material 414b can be placed over at least a portion of the microelectronic support device 405, the bonding wires 444, and/or a portion of the microelectronic device 410 to provide structural integrity and/or protection from the environment. Additionally, in certain embodiments the microelectronic device 410 can be structurally coupled to the microelectronic support device 405 (e.g., by an adhesive 446). Some embodiments of the microelectronic support device 405, discussed with reference to FIG. 4 can have features and advantages similar to those discussed with reference to FIGS. 2A-3.

The embodiments of the microelectronic support device 405 and associated methods discussed above with reference to FIG. 4 can be modified in additional embodiments of the invention. For example, although in the illustrated embodiment an adhesive 446 is used to structurally couple the microelectronic device 410 to the microelectronic support device 405, in other embodiments the microelectronic device 410 can be coupled to the microelectronic support device 405 via other methods (e.g., via screw(s) and/or clip(s)). In still other embodiments, the microelectronic device assembly 400 includes various arrangements, for example, the microelectronic device assembly 400 can have a board on chip or chip on board configuration. In yet other embodiments, the microelectronic device assembly 400 can include different combinations of first and second protective materials 414a, 414b, more protective materials, or does not include a first and/or second protective material 414a, 414b.

From the foregoing, it will be appreciated that specific embodiments of the invention have been described herein for purposes of illustration, but that various modifications may be made without deviating from the invention. Additionally, aspects of the invention described in the context of particular embodiments may be combined or eliminated in other embodiments. For example, in other embodiments a microelectronic device can include multiple microfeature workpieces (e.g., multiple workpieces coupled together), with at least one microfeature workpiece being configured to have one or more of the features described above. Although advantages associated with certain embodiments of the invention have been described in the context of those embodiments, other embodiments may also exhibit such advantages. Additionally, not all embodiments need necessarily exhibit such advantages to fall within the scope of the invention. Accordingly, the invention is not limited except as by the appended claims.

We claim:

1. A microelectronic support device, comprising:
a support member having a first side, a second side, and a passageway extending through the support member between a first aperture in the first side and a second aperture in the second side;
a support contact having a first surface and a second surface, the support contact being carried by the second side and being positioned to cover at least a portion of the second aperture, at least a portion of the first surface of the support contact being positioned to be accessible through the first aperture and the passageway; and
a bond wire connected to the first surface of the support contact, the bond wire having a portion extending through the first aperture.

2. The device of claim 1, further comprising a protective material covering at least a portion of the second side of the support member, at least a portion of the second surface of the support contact, or both.

3. The device of claim 1 wherein the support contact is positioned to cover the entire second aperture.

4. The device of claim 1 wherein at least a portion of the first surface of the support contact is mounted to the second side of the support member.

5. The device of claim 1 wherein the support contact extends through at least a portion of the passageway.

6. The device of claim 1 wherein the second aperture is smaller than the first aperture and the passageway is tapered as it extends between the first aperture and the second aperture.

7. The device of claim 1 wherein the support contact includes a first support contact, and wherein the device further comprises at least one second support contact carried by the first side.

8. The device of claim 1 wherein the passageway includes a first passageway and the support contact includes a first support contact, and wherein the device further comprises:
a second passageway extending through the support member between a third aperture in the first side and a fourth aperture in the second side;

a second support contact having a first surface and a second surface, the second support contact being carried by the second side and being positioned to cover at least a portion of the fourth aperture, at least a portion of the first surface of the second support contact being positioned to be accessible through the third aperture and the second passageway.

9. The device of claim 1, further comprising a connector connected to the first surface of the support contact and extending through the first aperture.

10. The device of claim 1, further comprising a bond wire connected to the first surface of the support contact and extending through the first aperture.

11. The device of claim 1 wherein the support contact has a first portion and a second portion, each portion being comprised of a different material.

12. The device of claim 1 wherein the support contact is electrically coupled to an element of the microelectronic support device.

13. A microelectronic support device, comprising:
a support member having a side and an aperture in the side;
a first support contact being recessed from the side, the first support contact having a surface, the surface of the first support contact being accessible through the aperture; and
a non-recessed second support contact carried by the side of the support member.

14. The device of claim 13 further comprising a connector extending through the aperture and being connected to the surface of the first support contact.

15. A microelectronic device assembly, comprising:
a microfeature workpiece having a first workpiece contact and a second workpiece contact;
a connector;
a bond wire;
a support having a side;
a first support contact carried by the side of the support, the first support contact being connected to the first workpiece contact via the first connector; and
a second support contact carried by the support and recessed from the side, the second support contact being connected to the second workpiece contact via the bond wire.

16. The assembly of claim 15 wherein the microfeature workpiece includes a third workpiece contact, and wherein the assembly further comprises:
a second connector; and
a third support contact carried by the first side, the third support contact being connected to the third workpiece contact via the second connector.

17. The assembly of claim 15 wherein the microfeature workpiece includes a third workpiece contact, and wherein the assembly further comprises:
a second bond wire; and
a third support contact carried by the support and recessed from the first side, the third support contact being connected to the third workpiece contact via the second bond wire.

* * * * *